(12) United States Patent
Sasaki (10) Patent No.: US 6,778,036 B2
(45) Date of Patent: Aug. 17, 2004

(54) HIGH-FREQUENCY CIRCUIT DEVICE HAVING ISOLATOR PORTS EACH HAVING TWO TERMINALS

(75) Inventor: Yoshinobu Sasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/893,898

(22) Filed: Jun. 29, 2001

(65) Prior Publication Data

US 2002/0075075 A1 Jun. 20, 2002

(30) Foreign Application Priority Data

Dec. 15, 2000 (JP) ........................................ 2000-382593

(51) Int. Cl.[7] ................................................ H01P 1/36
(52) U.S. Cl. ........................ 333/24.2; 333/1.1; 330/295
(58) Field of Search ................................ 333/1.1, 24.2, 333/35; 330/124 R, 295

(56) References Cited

U.S. PATENT DOCUMENTS 4,028,632 A * 6/1977 Carter et al. ........... 333/24.2 X
4,309,666 A * 1/1982 Ito et al. ................... 333/1.1 X
4,965,530 A * 10/1990 Katz ....................... 330/295 X
5,945,887 A * 8/1999 Makino et al. ............... 333/1.1

* cited by examiner

Primary Examiner—Stephen E. Jones
(74) Attorney, Agent, or Firm—McDermott Will & Emery LLP (57) ABSTRACT

A high-frequency circuit device includes a distribution circuit (16) for distributing a signal inputted from a signal input terminal (20) to a plurality of first lines (16b) through a branch portion (16a), a synthetic circuit (18) for combining signals inputted from a plurality of second lines (18b) into one through a combined portion (18a) as an output signal and outputting it from a signal output terminal (22), transistors (14) respectively placed between the first lines (16b) of the distribution circuit (16) and the second lines (18b) of the synthetic circuit (18), and Isolators (24) respectively connected between the transistors (14) and the signal input terminal (20) and between the transistors (14) and the signal output terminal (22).

2 Claims, 11 Drawing Sheets

Prior Art

Fig.14

Prior Art

HIGH-FREQUENCY CIRCUIT DEVICE HAVING ISOLATOR PORTS EACH HAVING TWO TERMINALS

BACKGROUND OF THE INVENTION

1. Field of the Invention

The present invention relates to a high-frequency circuit device, and particularly to a high-frequency circuit device suitable for use in a terminal device for mobile communications.

2. Description of the Related Art

Figure 13:
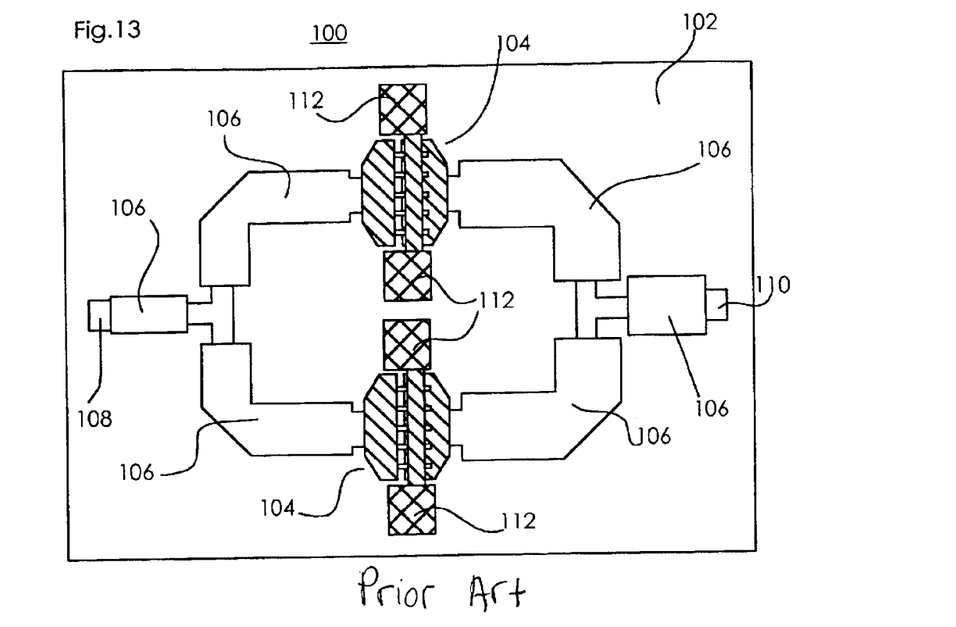
FIG. 13 is a plan view illustrating a conventional high output amplifier.
Figure 14:
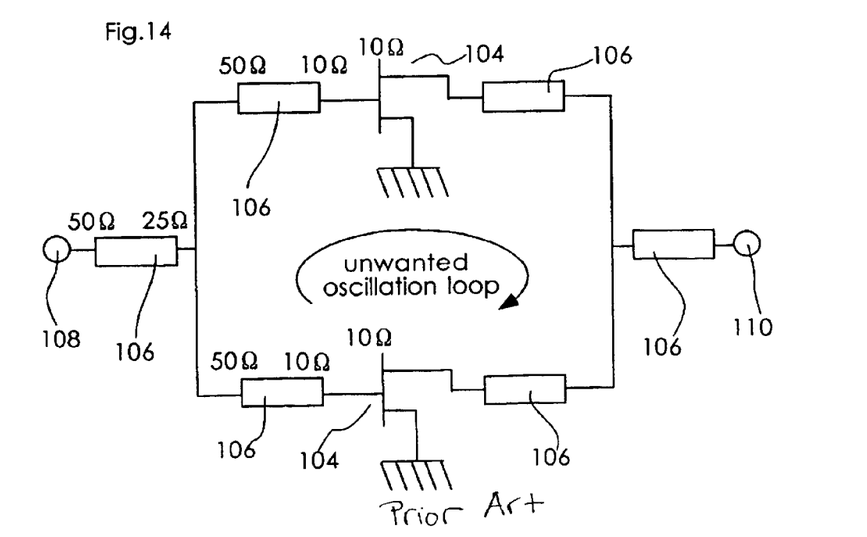
FIG. 14 is a circuit diagram showing an equivalent circuit of the conventional high output amplifier.

FIG. 13 is a plan view of a conventional high output amplifier. FIG. 14 is a circuit diagram showing an equivalent circuit of the high output amplifier.

In FIG. 13, reference numeral 100 indicates a high output amplifier, reference numeral 102 indicates a semiconductor substrate, reference numerals 104 indicate transistors, reference numerals 106 indicate microstrip lines each having a λ/4 electrical length, which are respectively impedance converter circuits, reference numeral 108 indicates a signal terminal, reference numeral 110 indicates a signal output terminal, and reference numerals 112 indicate via holes, respectively. A chip size of the high output amplifier 100 is normally a square of 1 mm to several tens of mm in most cases. A ground conductor is formed on the back or reverse side of the semiconductor substrate 102. The thickness of the semiconductor substrate ranges from about 30 μm to about 150 μm.

The transistors 104 used as basic elements of the high output amplifier 100 are commonly very low in input/output impedance (25 Ω or less). In addition to it, a plurality of transistors are normally arranged in parallel to increase an output voltage. Therefore, the impedance is further lowered.

On the other hand, since the characteristic impedance of an external circuit is set to 50 Ω as a standard, it is necessary to provide means for matching the impedances of the two to each other. One used for its purpose is a method of using a microstrip line having a λ/4 electrical length as an impedance converter circuit.

When the input impedances of each single transistors 104 are supposed to be 10 Ω as shown in FIG. 14, they are respectively converted to 50 Ω by λ/4 electrical-length microstrip lines adjacent to the transistors 104, which in turn are combined into one. Thus, a method is adopted in which since the resultant characteristic impedance results in a half 25 Ω, it is converted to 50 Ω by a λ/4 electrical-length microstrip line adjacent to the signal input terminal 108, whereby matching with the external circuit is made. This method is commonly used in a high output amplifier because a design error is small and capacitors and inductors are unnecessary.

However, the method using the λ/4 electrical-length microstrip lines as the impedance converter circuits has the following problems.

Firstly, the configuration shown in FIG. 13 is easy to form such an unwanted or unnecessary oscillation loop as shown in FIG. 14 and produce oscillations. The isolation (backward transfer characteristic) of each transistor may be set larger than forward gain to make it hard to produce the unwanted oscillation loop. However, the isolation of the transistor is commonly deteriorated as the frequency increases. It is thus difficult to ensure it. Assuming that the operating frequency is 5 GHz, for example, the gain of a high output transistor at 5 GHz ranges from 15 dB to 25 dB, whereas the isolation thereof ranges from –20 dB∼–30 dB. It cannot be said that the difference between the two is sufficient.

Further, in the configuration shown in FIG. 13, an input-side matching circuit and an output-side matching circuit respectively need three-by-three λ/4 electrical-length microstrip lines.

Assuming that the operating frequency is 5 GHz and the shortening coefficient of a waveform on the semiconductor substrate 102 is 1/2.5, the λ/4 electrical-length microstrip line needs a length of 6 mm. When six λ/4 electrical-length microstrip lines are used, a chip size becomes a square of several tens of mm even at the minimum. This might cause an obstacle to a reduction in size and cost. When the microstrip line is used as for an information terminal for mobile communications in particular, a reduction in size and cost is a large item to be considered from the viewpoint of design in a portable or cellular telephone or the like in particular. There were often difficulties in satisfying its design requirements.

Incidentally, Japanese Patent Application Laid-Open No. Sho 64-1301 describes an MIC isolator but has not a description thereof used in a distribution/synthetic circuit.

SUMMARY OF THE INVENTION

The present invention has been made to solve the above-described problems. Therefore, an object of the present invention is to obtain a high-frequency circuit device hard to produce unnecessary oscillations.

According to one aspect of the invention, there is provided a high-frequency circuit device comprising: a distribution circuit for distributing a signal inputted from a signal input terminal to a plurality of first lines through a branch portion; a synthetic circuit for combining signals inputted from a plurality of second lines into one through a combined portion as an output signal and outputting it from a signal output terminal; transistors respectively placed between one ends of each individual first lines of the distribution circuit and one ends of each individual second lines of the synthetic circuit; and isolators respectively connected between the transistors and the signal input terminal and between the transistors and the signal output terminal.

Accordingly, this inventive high-frequency circuit device makes it hard to form an unwanted oscillation loop. In its turn, a high-reliability high-frequency circuit device can be configured.

Another object of the present invention is to obtain a small-sized and low-cost high-frequency circuit device.

According to another aspect of the invention, there is provided a high-frequency circuit device comprising: a distribution circuit for distributing a signal inputted from a signal input terminal to a plurality of first lines respectively having a plurality of first impedance converter circuits through a branch portion; a synthetic circuit for combining signals inputted from a plurality of second lines each having a second impedance converter circuit into one through a combined portion as an output signal and outputting it from a signal output terminal; transistors respectively placed between one ends of each individual first lines of the distribution circuit and one ends of each individual second lines of the synthetic circuit; and isolators connected either between the transistors and the branch portion of the distribution circuit or between the transistors and the combined portion of the synthetic circuit.

Accordingly, this inventive high-frequency circuit device makes it hard to form an unwanted oscillation loop and allows a reduction in the number of the isolators, whereby a required substrate area can be reduced. In its turn, a high-reliability, and small and inexpensive high-frequency circuit device can be configured.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENT

Preferred embodiments of the present invention will hereinafter be described in detail with reference to the accompanying drawings.

First Embodiment

The first embodiment is one wherein isolators kept constant in input/output impedance are respectively connected between microstrip lines having $\lambda/4$ electrical lengths, which are used as input impedance converter circuits, and transistors and between microstrip lines having $\lambda/4$ electrical lengths, which are used as output impedance converter circuits, and the transistors, and the isolators are enhanced in isolation.

Figure 1:
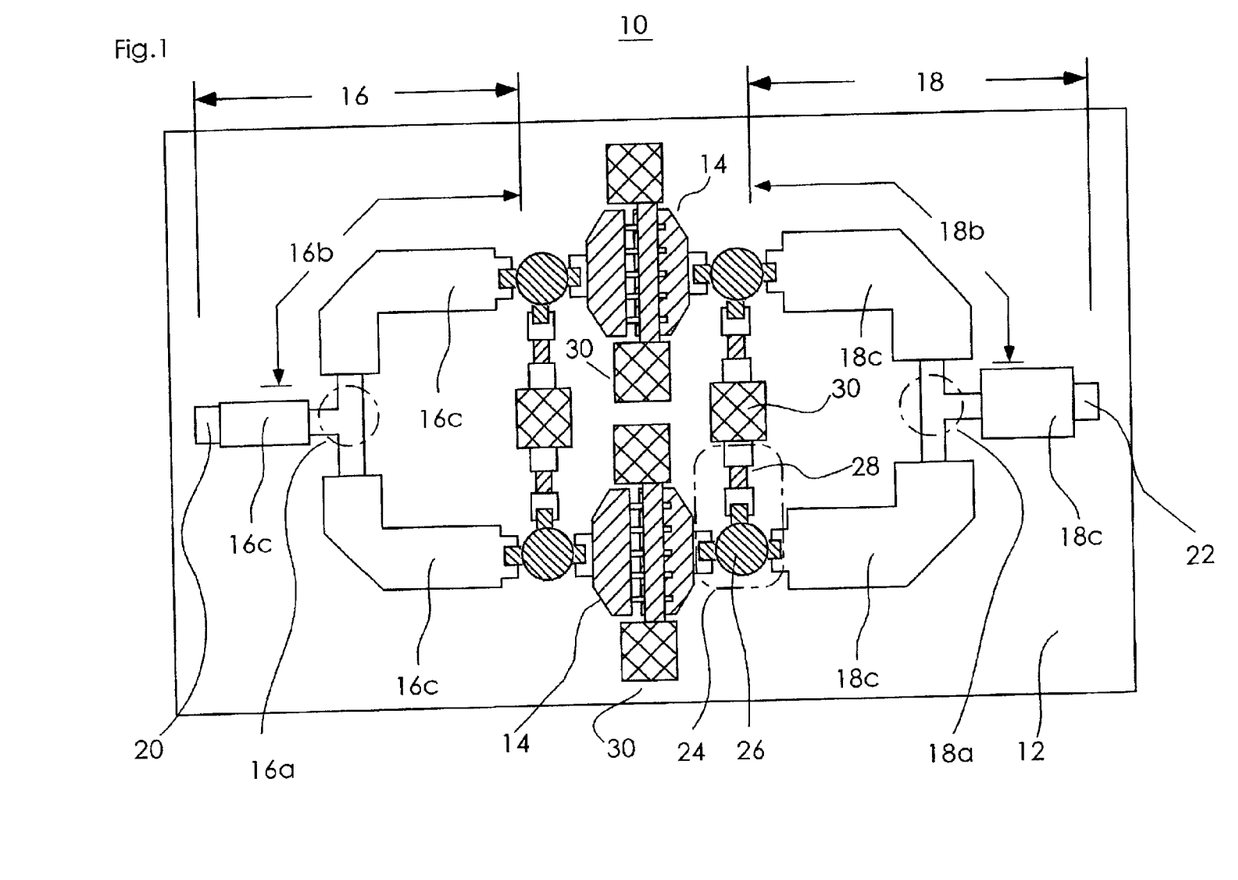
FIG. 1 is a plan view showing a high output amplifier in accordance with one embodiment of the invention.
Figure 2:
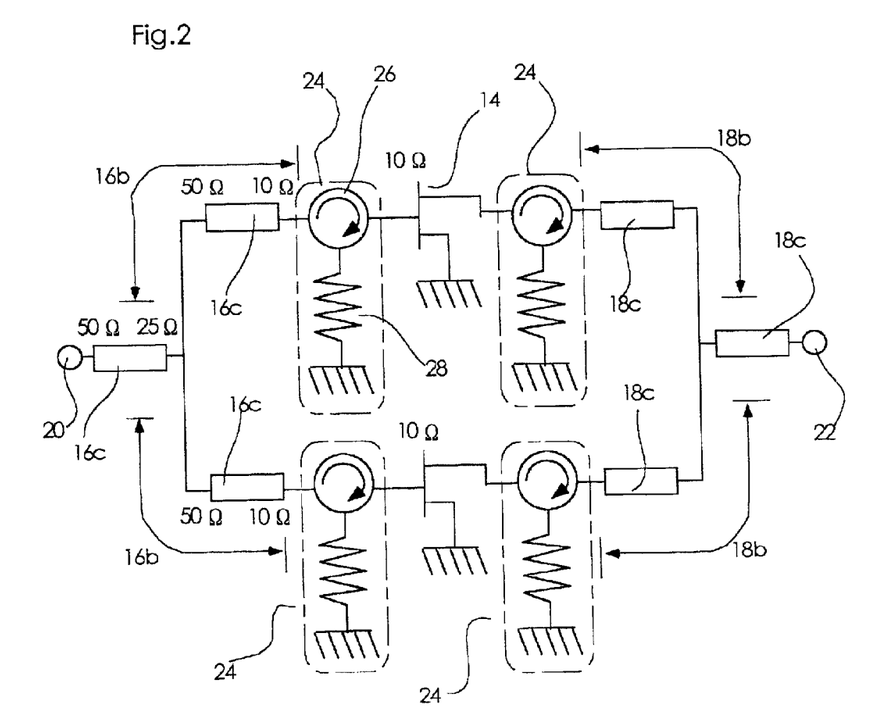
FIG. 2 is a circuit diagram illustrating an equivalent circuit of the high output amplifier shown in FIG. 1.

FIG. 1 is a plan view of a high output amplifier according to the first embodiment. FIG. 2 is a circuit diagram showing an equivalent circuit of the high output amplifier shown in FIG. 1.

In FIG. 1, reference numeral 10 indicates the high output amplifier. The high output amplifier 10 constitutes an MMIC chip. Reference numeral 12 indicates a semiconductor substrate, which is comprised, for example, GaAs, InP, Si or the like. A chip size is a square of from 1 mm to several tens of mm, and the thickness of the semiconductor substrate ranges form 30 $\mu$m to 150 $\mu$m. A ground conductor (not shown) such as Au is formed on the back or reverse side of the semiconductor substrate 12. Reference numerals 14 indicate transistors placed on the semiconductor substrate 12. In the present embodiment, FETs are used as the transistors. Reference numeral 16 indicates a distribution circuit, i.e., a divider circuit, placed on the semiconductor substrate 12. Reference numeral 16a indicates a branch portion of the distribution circuit 16. Reference numerals 16b indicate a plurality of first lines which branch off from the branch portion 16a of the distribution circuit 16. In the present embodiment, the two branch off from the branch portion 16a. Reference numerals 16c indicate impedance converter circuits which constitute the first lines 16b respectively. They are, for example, low-impedance microstrip lines, i.e., microstrip lines each having a $\lambda/4$ electrical length.

Reference numeral 18 indicates a composite or synthetic circuit, i.e., a combiner circuit, placed in the semiconductor substrate 12. Reference numeral 18a indicates a confluent or combined portion of the synthetic circuit 18. Reference numerals 18b indicate second lines constituting branch lines, which join the combined portion 18a of the synthetic circuit 18. Reference numerals 18c indicate impedance converter circuits which constitute the second lines 18b respectively. They are, for example, low-impedance microstrip lines, i.e., microstrip lines each having a $\lambda/4$ electrical-length.

Reference numeral 20 indicates a signal input terminal for applying a signal to the distribution circuit 16. Reference numeral 22 indicates a signal output terminal for outputting a signal from the synthetic circuit 18.

Reference numerals 24 indicate isolators, reference numerals 26 indicate circulators which constitute the isolators 24 respectively. Reference numerals 28 indicate terminal resistors respectively. Reference numerals 30 indicate via holes which are connected from circuits on the surface of the semiconductor substrate 12 to the ground conductor formed on the back of the semiconductor substrate 12.

Each of the isolators 24 has input and output ports connected between a gate used as a control electrode of the transistor 14 and the microstrip line 16c having the $\lambda/4$ electrical length on the signal input side of the transistor 14. Each of the isolators 24 has input and output ports connected between a drain electrode of the transistor 14 and the microstrip line 18c having the $\lambda/4$ electrical length on the signal output side of the transistor 14. The terminal resistors 28 are connected to their corresponding via holes 30.

Figure 3:
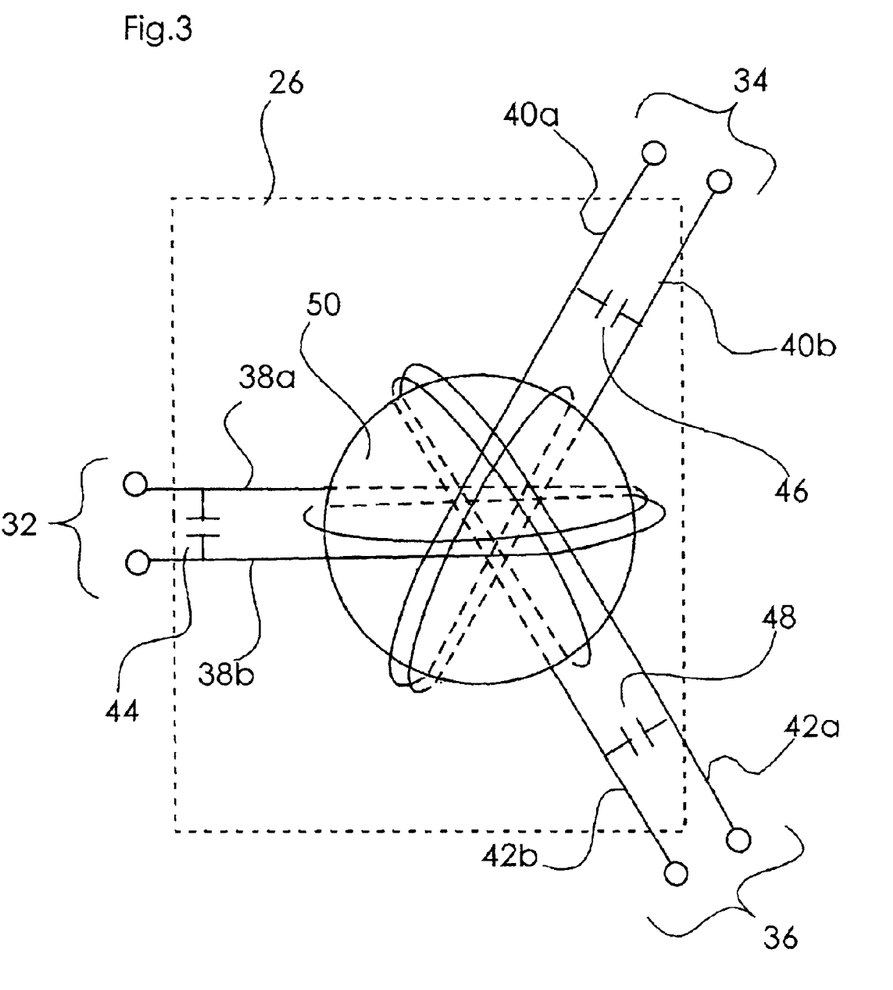
FIG. 3 is a typical diagram depicting an internal configuration of a circulator in accordance with one embodiment of the invention.
Figure 4:
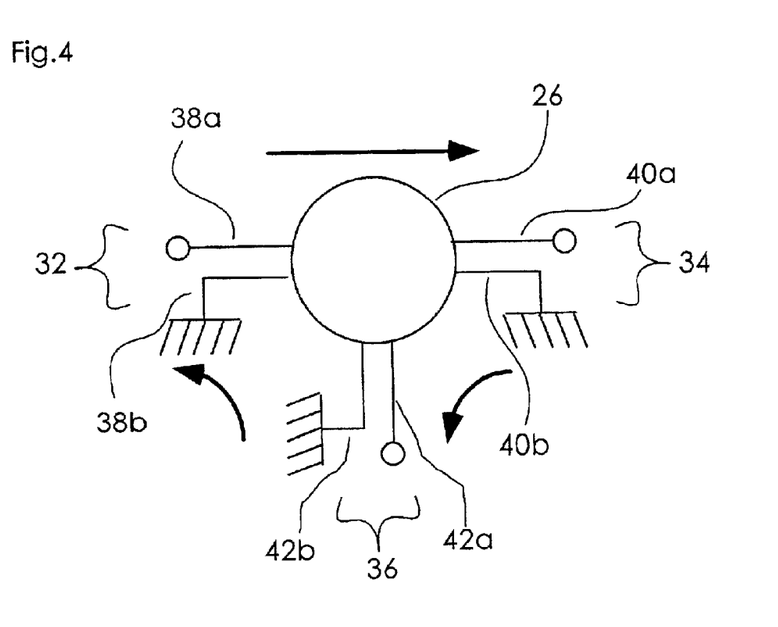
FIG. 4 is a typical diagram showing the flow of high-frequency signals in the circulator in accordance with one embodiment of the invention.

FIG. 3 is a typical diagram showing an internal configuration of the circulator 26 which constitutes the isolator 24 according to the first embodiment. FIG. 4 is a typical diagram illustrating the flow of high-frequency signals in the circulator 26.

In FIG. 3, the circulator 26 comprises three ports which are portions for generally inputting and outputting signals, i.e., a first port 32, a second port 34 and a third port 36. Signal lines for the first port 32, second port 34 and third port 36 comprise microstrip lines respectively, which correspond to a signal line 38 (comprising 38a and 38b), a signal line 40 (comprising 40a and 40b) and a signal line 42 (comprising 42a and 42b) respectively.

Reference numerals 44, 46 and 48 indicate impedance matching capacitors respectively. Reference numeral 50 indicates a ferrite which constitutes a magnet for applying a magnetic field.

The respective one signal lines of the signal lines 38, 40 and 42 of the circulator 26 are grounded. In FIG. 4, for example, the signal line 38b, signal line 40b and signal line 42b are grounded.

In FIG. 4, a signal inputted to the first port 32 is outputted to the second port 34, a signal inputted to the second port 34 is outputted to the third port 36, and a signal inputted to the third port 36 is outputted to the first port 32.

A circulator in which one port, e.g., the third port of the circulator 26 is connected to its corresponding terminal resistor, is called an "isolator".

Figure 5:
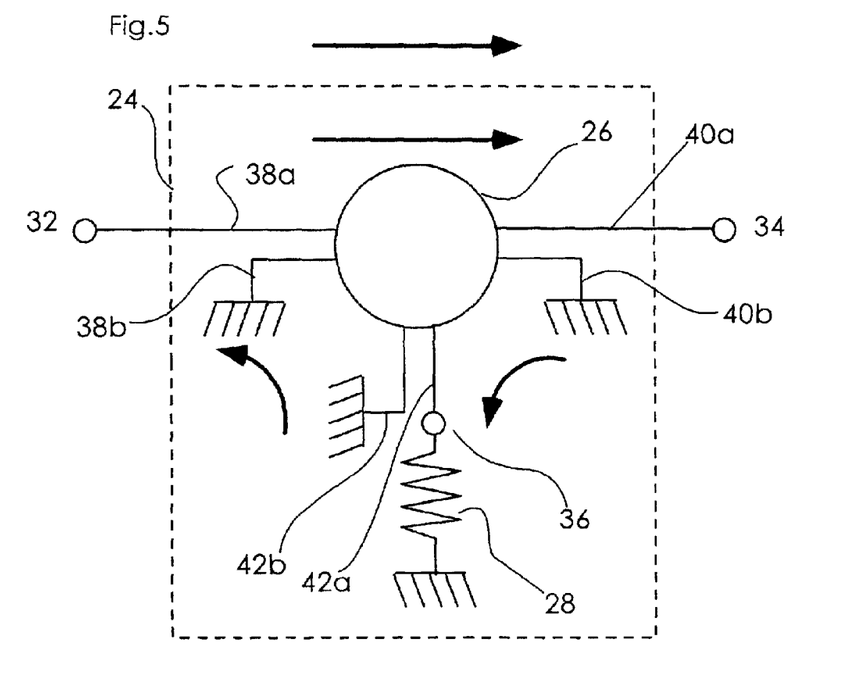
FIG. 5 is a typical diagram illustrating the flow of high-frequency signals in an isolator in accordance with one embodiment of the invention.

FIG. 5 is a typical diagram showing the flow of high-frequency signals in an isolator according to the present invention.

In FIG. 5, reference numeral 24 indicates an isolator. The same reference numerals as those in FIG. 4 are the same ones or equivalents. Even in the following drawings, the same reference numerals are the same ones or equivalents.

In the isolator 24 shown in FIG. 5, a signal line 42a of a third port 36 of a circulator 26 is connected to a terminal resistor 28. In the isolator 24, a signal applied to a first port 32 is outputted to a second port 34. Since, however, a signal applied to the second port 34 is outputted to the terminal resistor 28 of the third port 36, it is consumed thereat. Since no signal is produced from the terminal resistor 28, the signal is not outputted to the first port 32. Thus, the isolator 24 implements one-way traffic of a high-frequency signal, and the value of isolation thereof normally ranges from –15 dB~–20 dB.

Figure 6:
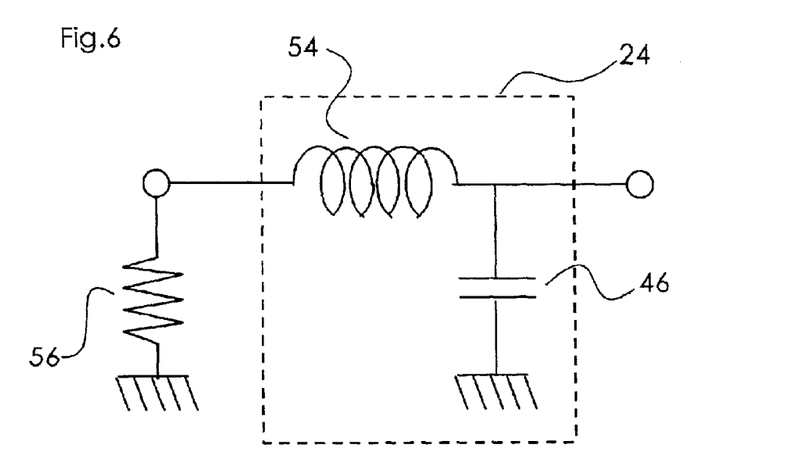
FIG. 6 is a circuit diagram depicting an equivalent circuit as viewed from a port 2 of the isolator in accordance with one embodiment of the invention.

FIG. 6 is a circuit diagram showing an equivalent circuit as viewed from a port 2 of the isolator according to the present invention.

In FIG. 6, reference numeral 54 indicates an equivalent inductance and reference numeral 56 indicates an equivalent resistor having the same value as a characteristic impedance.

Incidentally, the isolator 24 according to the present embodiment has an input/output impedance matched to an input/output impedance of the transistor 14.

Assuming that the input/output impedance of the transistor 14 is set as 10 Ω as shown in FIG. 2, the input/output impedance of the isolator 24 is also matched with 10 Ω in this case. Since the isolators are identical to each other in input/output impedance, impedance matching is carried out by microstrip lines 16c each having a λ/4 electrical length.

Namely, the input/output impedances of the isolators 24 are respectively converted to 50 Ω by the λ/4 electrical-length microstrip lines 16c for first lines 16b adjacent to the isolators 24. The resultant converted impedances are combined into one by the two first lines 16b. Consequently, the resultant characteristic impedance is brought to a half 25 Ω. Therefore, the resultant impedance 25 Ω is converted to 50 Ω by a λ/4 electrical-length microstrip line 16c provided between a branch portion 16a and a signal input terminal 20 to thereby make matching with an external circuit.

Incidentally, the impedance after having been converted by the λ/4 electrical-length microstrip line 16c constituting the first line 16b adjacent to each isolator 24, may be an arbitrary value. In this case, however, the impedance of each transistor 14 is matched to 10 Ω and the input/output impedance of each isolator 24 is also matched to 10 Ω.

Further, the first lines 16b adjacent to the isolators 24 are separated into two. Therefore, the impedance is from over 10 Ω to under 100 Ω.

A description has been made of the signal input side of each transistor 14 in the present embodiment. While, however, the impedance is slightly increased on the signal output side, the impedances of the isolators 24 and their corresponding λ/4 electrical-length microstrip lines 18c are similarly set.

In the high output amplifier 10, the isolators identical in input/output impedance are respectively connected between the λ/4 electrical-length microstrip lines 16c on the signal input side and their corresponding transistors 14 and between the λ/4 electrical-length microstrip lines 18c on the signal output side and their corresponding transistors 14, whereby isolation is improved. Therefore, the high output amplifier is hard to configure an unwanted oscillation loop.

Assuming that for instance, the gain of the high-output transistor 14 at 5 GHz ranges from 15 dB to 25 dB, whereas the isolation of the transistor is –20 dB and the isolation per isolator 24 is –15 dB, the isolation of each isolation 24 becomes –30 dB because the number of the isolators 24 is two per transistor. Summing the isolation of each isolation 24 and the isolation of each transistor 14 yields –50 dB or less. Since the difference between the two is sufficiently ensured as compared with the gain of the transistor 14, the unwanted oscillation loop is not established, and hence the stable operation of the high output amplifier 10 can be implemented. In its turn, the high output amplifier 10 high in reliability can be configured.

Although the isolators 24 are respectively placed before and behind the transistors 14 in the high output amplifier 10, they may be provided either before or after.

Second Embodiment

The present embodiment is one wherein isolators different from one another in input impedance and output impedance are respectively provided between first lines and transistors and between second lines and the transistors without having to use the λ/4 electrical-length microstrip lines used as the input/output impedance converter circuits, whereby impedance matching and the ensuring of isolation are performed.

Figure 7:
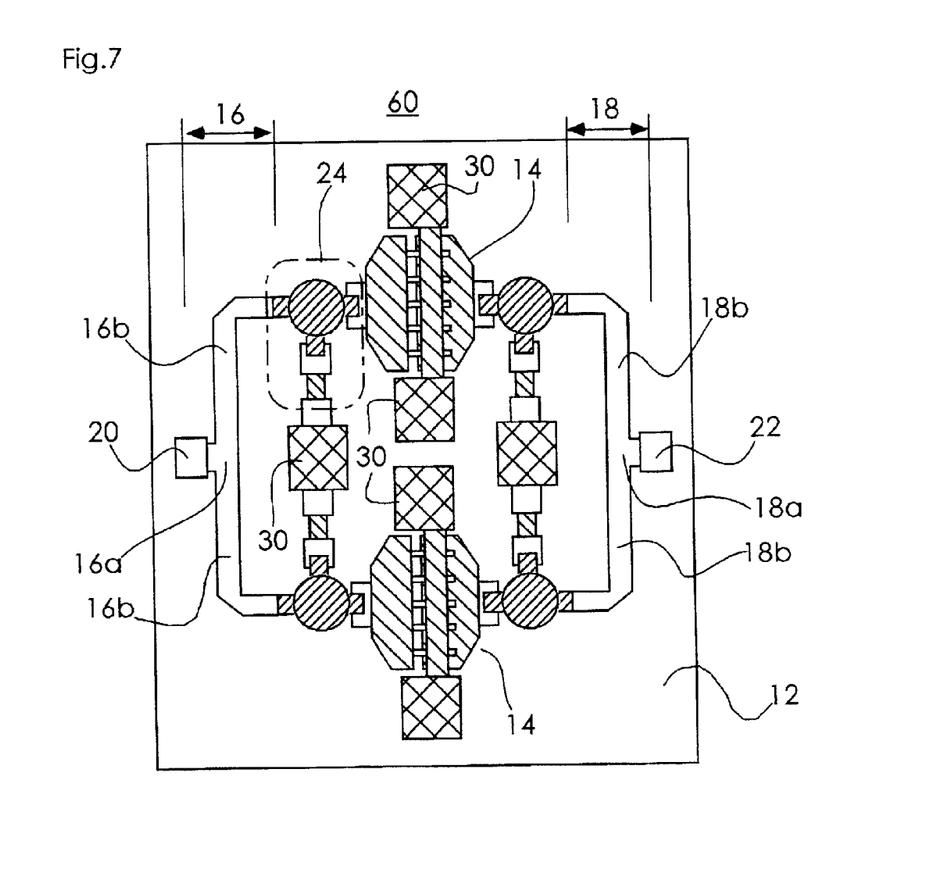
FIG. 7 is a plan view showing a high output amplifier in accordance with another embodiment of the invention.
Figure 8:
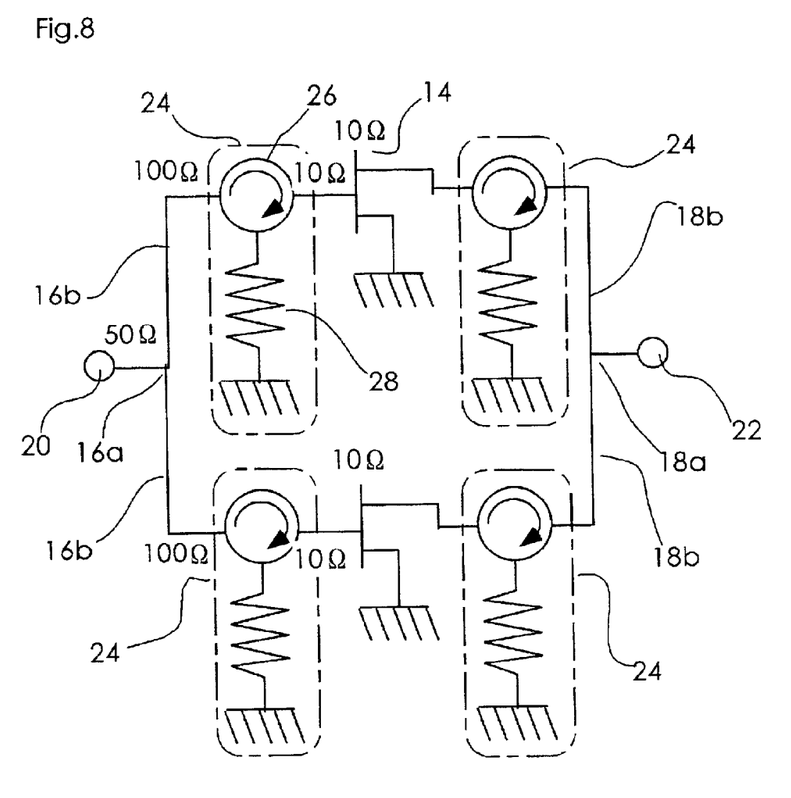
FIG. 8 is a circuit diagram illustrating an equivalent circuit of the high output amplifier shown in FIG. 7.

FIG. 7 is a plan view of a high output amplifier according to the second embodiment. FIG. 8 is a circuit diagram showing an equivalent circuit of the high output amplifier shown in FIG. 7.

In FIG. 7, reference numeral 60 indicates a high output amplifier. The high output amplifier 60 is configured as an MMIC chip.

While the isolators having the values identical to each other in input impedance and output impedance are used in the first embodiment, isolators having values different from one another in input impedance and output impedance are used in the second embodiment.

Each of isolators 24 has signal input and output ports connected between a gate used as a control electrode of a transistor 14 and a first line 16b on the signal input side of the transistor 14. Each of the isolators 24 has signal input and output ports connected between a drain electrode of the transistor 14 and a second line 18b on the signal output side of the transistor 14. Terminal resistors 28 are connected to their corresponding via holes 30.

Assuming that the impedance of each transistor 14 is 10 Ω, the impedance of the isolators 24 on the transistor 14 side is matched to the transistor 14 and set to 10 Ω, and the impedance of the isolators 24 on the first port 32 side as viewed from the signal input side is set to 100 Ω. When the impedances on the first port 32 side, each of which has been set to 100 Ω, are combined into one by the two first lines 16b, the combined impedance results in a half 50 Ω, whereby the matching with an external circuit is achieved.

Since the isolators 24 perform impedance matching in the high output amplifier 60, it is not necessary to additionally provide impedance matching circuits, e.g., λ/4 electrical-length microstrip lines. Further, a chip is angled so that a chip size ranges from about 4 mm to about 5 mm. The chip size can be reduced as compared with the provision of the impedance matching circuits. Therefore, the high output amplifier 60 can be reduced in size and an expensive semiconductor substrate can rendered small and configured at a low price.

Third Embodiment

The present embodiment is one wherein isolators are respectively configured with both line ends of their input/output ports as signal line ends at either ones of the respective input/output ports, i.e., the isolators are placed at a branch portion of a distribution circuit and a confluent or combined portion of a synthetic circuit, the isolators provided at the branch portion are connected to first lines different from each other with both line ends of its output ports as signal line ends, and the isolators provided at the combined portion are connected to second lines different from each other with both line ends of its input ports as signal line ends.

Figure 9:
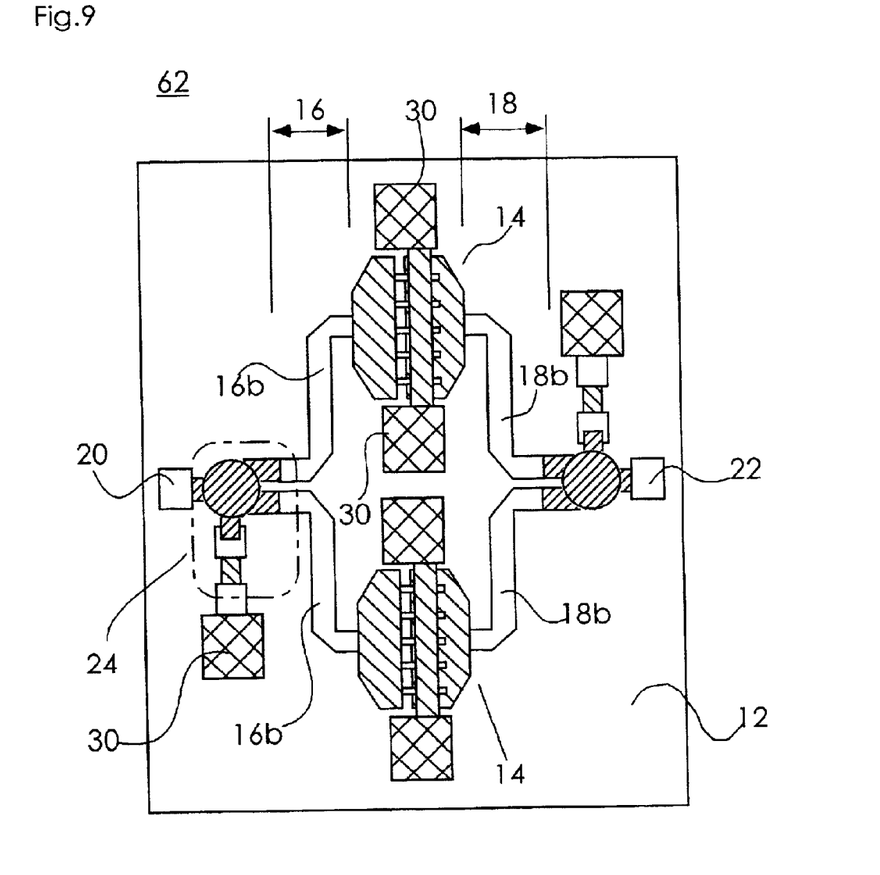
FIG. 9 is a plan view depicting a high output amplifier in accordance with further embodiment of the invention.
Figure 10:
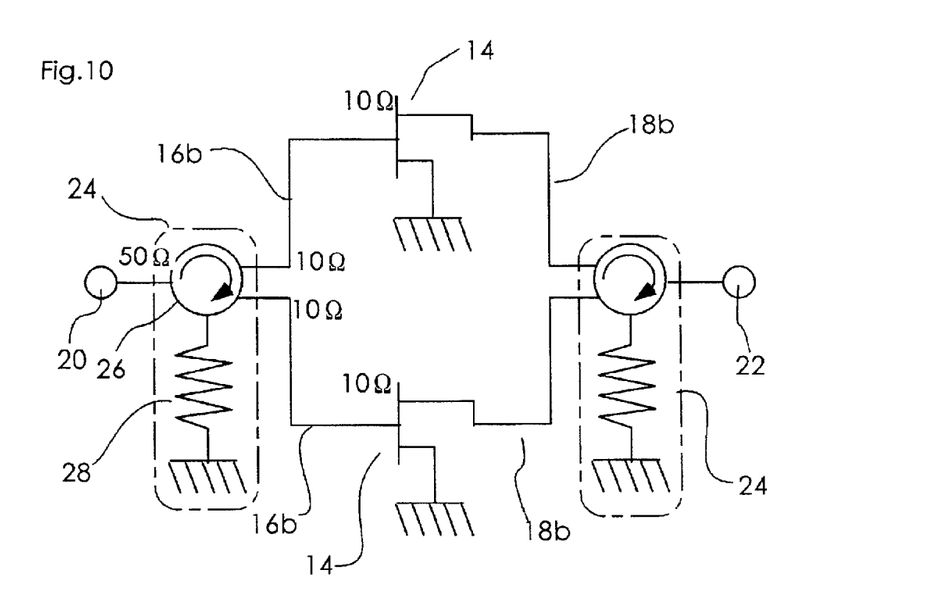
FIG. 10 is a circuit diagram showing an equivalent circuit of the high output amplifier shown in FIG. 9.

FIG. 9 is a plan view of a high output amplifier according to the third embodiment. FIG. 10 is a circuit diagram showing an equivalent circuit of the high output amplifier shown in FIG. 9.

In FIG. 9, reference numeral 62 indicates a high output amplifier. The high output amplifier 62 is made up of an MMIC chip.

In the present embodiment, isolators 24 are placed at a branch portion 16a of a distribution circuit 16 and a confluent or combined portion 18a of a synthetic or combination circuit 18 respectively.

Figure 11:
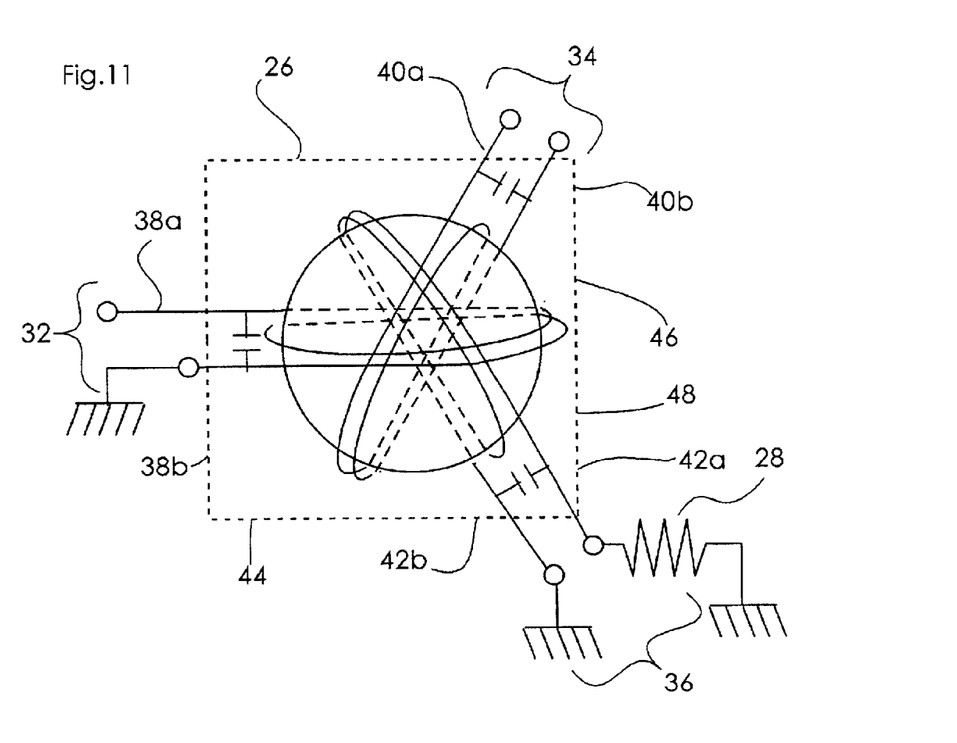
FIG. 11 is a typical diagram illustrating an internal configuration of a circulator in accordance with further embodiment of the invention.
Figure 12:
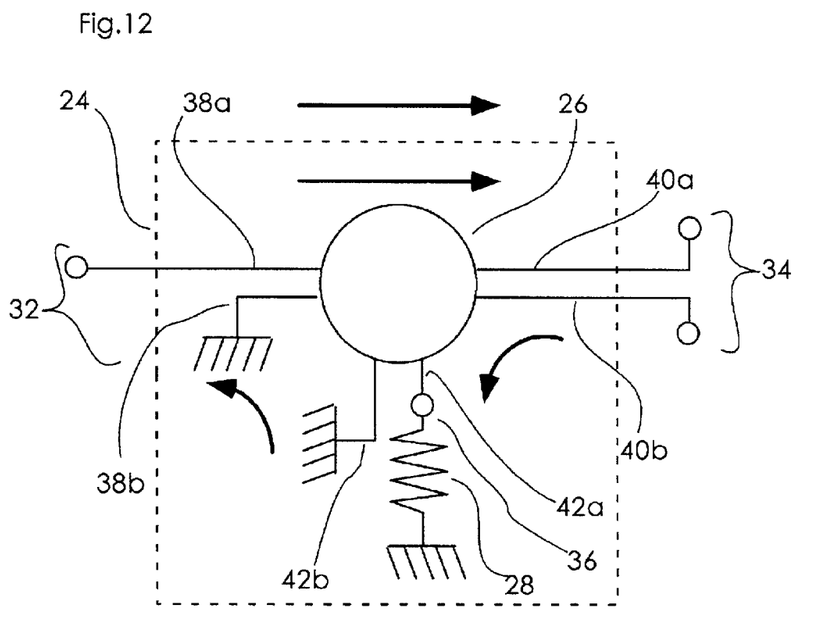
FIG. 12 is a typical diagram showing the flow of high-frequency signals in an isolator in accordance with further embodiment of the invention.

FIG. 11 is a typical diagram showing an internal configuration of a circulator 26 which constitutes the isolator 24 according to the third embodiment. FIG. 12 is a typical diagram showing the flow of high-frequency signals in the isolator 24.

In the circulator 26 employed in each of the isolators 24 according to the first and second embodiments, one signal lines of the signal lines 38, 40 and 42 are grounded. In FIG. 4, for example, 38b, 40b and 42b are grounded.

On the other hand, in the third embodiment, one signal lines of signal lines 38 and 42 are grounded but 40a and 40b of a signal line 40 are both not grounded, as shown in FIG. 11 in the circulator 26 of the isolator 24 provided at the branch portion 16a of the distribution circuit 16. In the isolator 24 placed at the branch portion 16a of the distribution circuit 16, the signal line 38 of a first port 32 is connected to its corresponding signal input terminal 20. Further, signal lines 40a and 40b of a second port 34 are connected to their corresponding first lines 16b different from each other and connected to their corresponding gate electrodes of transistors 14.

In the isolator 24 provided at the combined portion 18a of the synthetic circuit 18, one of the signal lines 40 and 42 is grounded but both 38a and 38b of the signal line 38 are not grounded. In the isolator 24 provided at the combined portion 18a of the synthetic circuit 18, the signal lines 38a and 38b of the first port 32 are connected to their corresponding second lines 18b different from each other and connected to their corresponding drain electrodes of the transistors 14.

In both the isolator 24 provided at the branch portion 16a of the distribution circuit 16, and the isolator 24 provided at the combined portion 18a of the combination circuit 18, a signal line 42a of a third port is connected to a terminal resistor.

Further, the isolator according to the third embodiment is controlled so as to vary the value of the input/output impedance. The impedance on the transistor side is formed so as to match with the value of the impedance of each transistor 14, whereas the impedance on another transistor side is matched to the characteristic impedance of the circuit. For example, the impedance on the transistor side is set to 10 Ω and the impedance on another transistor side is set to 50 Ω.

The flow of signals in a circulator 26 is similar to the first and second embodiments as shown in FIG. 12.

Incidentally, the high output amplifier 62 having such a configuration is operated as a push-pull amplifier.

In the high output amplifier 62 as described above, the isolators 24 are respectively configured with both line ends of either ones of the respective input/output ports as the signal line ends at either ones of their input/output ports. The isolators 24 are placed at the branch portion 16a of the distribution circuit 16 and the combined portion 18a of the combination or synthetic circuit 18. The isolator 24 placed at the branch portion 16a is connected to the first lines 16b different from each other with both line ends 40a and 40b of the second port 34 corresponding to its output port as the signal line ends. The isolator 24 provided at the combined portion 18a is connected to the second lines 18b different from each other with both line ends 38a and 38b of the first port 32 corresponding to its input port as the signal line ends. Owing to such a configuration, the number of the isolators 24 may be two at the minimum. The required number of isolators 24 is reduced as compared with the second embodiment, and the area of the chip can be further reduced. In its turn, a high-reliability amplifier can be configured which is small in size and hard to form an unwanted oscillation loop.

In the description referred to above, the configuration using the FET as the transistors has been explained. However, even if the transistors are comprised of HBT or bipolar transistors, a similar effect is brought about.

The MMIC-configured amplifier has been illustrated as the high output amplifier by way of example. However, even if an MIC-configured amplifier using discrete transistors is adopted, a similar effect is obtained.

While the isolator configured using the microstrip line has been illustrated as an example, an isolator using a coaxial cable may be used. Further, the isolator may be one configured as a chip. Alternatively, even if an isolator monolithically formed on an MMIC is adopted, a similar effect is brought about.

Since the high-frequency circuit device according to the present invention is provided with such a configuration as described above, it has the following advantageous effects.

According to the high-frequency circuit device according to the present invention, the high-frequency circuit device includes a distribution circuit for distributing a signal inputted from a signal input terminal to a plurality of first lines through a branch portion, a synthetic circuit for combining signals inputted from a plurality of second lines into one through a combined portion as an output signal and outputting it from a signal output terminal, transistors respectively placed between one ends of each individual first lines of the distribution circuit and one ends of each individual second lines of the synthetic circuit, and isolators respectively connected between the transistors and the signal input terminal and between the transistors and the signal output terminal. Such a configuration makes it hard to form an unwanted oscillation loop. In its turn, a high-reliability high-frequency circuit device can be configured.

Also, the first and second lines respectively have impedance converter circuits and the isolators are respectively connected between the transistors and the impedance converter circuits. It is thus possible to increase the gain and reduce the reflection of a signal. In its turn, a high-frequency circuit device can be configured which is reduced in loss and good in power efficiency.

Further, the transistors and the first lines, and the transistors and the second lines are respectively connected through the isolators. The impedance of each isolator on the transistor side is matched to that of each transistor. The values of impedances of the isolators on the first and second line sides are set higher than the impedance on the transistor side. This configuration allows a reduction in required substrate area. In its turn, a small-sized and inexpensive high-frequency circuit device can be configured.

Furthermore, the isolators are provided at the branch portion of the distribution circuit and the combined portion of the synthetic circuit. The isolators placed at the branch portion are respectively connected to the first lines different from one another with both line ends of their output ports as signal line ends. The isolators placed at the combined portion are respectively connected to the second lines different from one another with both line ends of their input ports as signal line ends. Thus, the number of the isolators can be reduced and a required substrate area can further be reduced. In its turn, a small-sized and inexpensive high-frequency circuit device can be configured.

A high-frequency circuit device comprises a distribution circuit for distributing a signal inputted from a signal input terminal to a plurality of first lines respectively having a plurality of first impedance converter circuits through a branch portion, a synthetic circuit for combining signals inputted from a plurality of second lines each having a second impedance converter circuit into one through a combined portion as an output signal and outputting it from a signal output terminal, transistors respectively placed between one ends of each individual first lines of the distribution circuit and one ends of each individual second lines of the synthetic circuit, and isolators connected either between the transistors and the branch portion of the distribution circuit or between the transistors and the combined portion of the synthetic circuit. Thus, such a configuration makes it hard to form an unwanted oscillation loop and allows a reduction in the number of the isolators, whereby a required substrate area can be reduced. In its turn, a high-reliability, and small and inexpensive high-frequency circuit device can be configured.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-382593, filed on Dec. 15, 2000 including specification, claims, drawings and summary, on which the Convention priority of the present application is based, are incorporated herein by reference in its entirety.

What is claimed is:

1. A high-frequency circuit device comprising:
   a distribution circuit for distributing a signal inputted from a signal input terminal to a plurality of first lines through a branch portion;
   a synthetic circuit for combining signals inputted from a plurality of second lines into one through a combined portion as an output signal and outputting the same from a signal output terminal;
   transistors respectively placed between an end of each individual first line of said distribution circuit and an end of each individual second line of said synthetic circuit;
   first isolator placed at the branch portion of said distribution circuit, the first isolator including an input port, an output port, and a third port each having two terminals, wherein one of the terminals of the input port is connected to the signal input terminal and the other terminal is grounded, both of the terminals of the output port is each connected to the corresponding first lines, and one of the terminals of the third port is connected to a terminal resistor and the other terminal is grounded; and
   second isolator placed at the combined portion of said synthetic circuit, the second isolator including an input port, an output port, and a third port each having two terminals, wherein both of the terminals of the input port is each connected to the corresponding second lines, one of the terminals of the output port is connected to the signal output terminal and the other terminal is grounded, and one of the terminals of the third port is connected to a terminal resistor and the other terminal is grounded.

2. The high-frequency circuit device according to claim 1, wherein at least one of said isolators is coupled to an impedance converter circuit.

* * * * *